United States Patent [19]

Masaki

[11] Patent Number: 4,552,829
[45] Date of Patent: Nov. 12, 1985

[54] TRANSFER SHEET WITH COLOR PATTERN HAVING METALLIC LUSTER, AND METHOD OF MANUFACTURING SAID SHEET

[76] Inventor: Jun Masaki, 9-11, Yamaashiya-cho, Ashiya-shi, Hyogo-ken, Japan

[21] Appl. No.: 650,280

[22] Filed: Sep. 14, 1984

Related U.S. Application Data

[62] Division of Ser. No. 581,829, Feb. 21, 1984.

[30] Foreign Application Priority Data

Mar. 31, 1983 [JP] Japan .................................. 58-57029
Oct. 31, 1983 [JP] Japan ................................ 58-204588

[51] Int. Cl.⁴ .......................... G03C 1/90; G03F 7/10; C03C 15/00; B44C 1/22
[52] U.S. Cl. ..................................... 430/258; 156/652; 156/658; 156/659.1; 430/320; 430/323
[58] Field of Search ....................... 430/258, 320, 323; 156/652, 658, 659.1

[56] References Cited

U.S. PATENT DOCUMENTS

| 4,158,079 | 6/1979 | Severus-Laubenfeld | 430/320 |
| 4,288,282 | 9/1981 | Brown et al. | 430/323 |
| 4,477,312 | 10/1984 | Czichy | 428/209 |

Primary Examiner—Richard L. Schilling
Attorney, Agent, or Firm—Hauke and Patalidis

[57] ABSTRACT

A transfer sheet with a color pattern having metallic luster comprising at least a transparent or semi-transparent base film, a mold-removing film layer on one side of the base film, a transparent coloring agent layer in the form of a desired pattern on the mold removing film layer, and an aluminium vapor-coated layer on the transparent coloring agent layer.

A method of manufacturing such transfer sheet.

1 Claim, 14 Drawing Figures

Fig. 1 (A) (PRIOR ART)
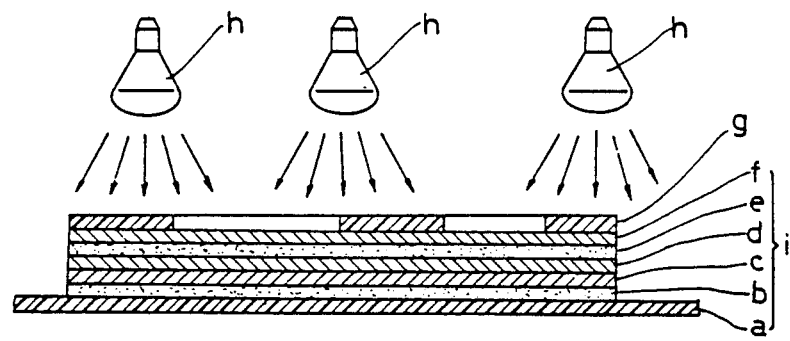
Fig. 1 (B) (PRIOR ART)
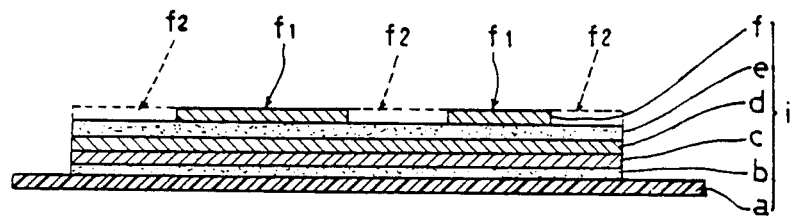
Fig. 1 (C) (PRIOR ART)
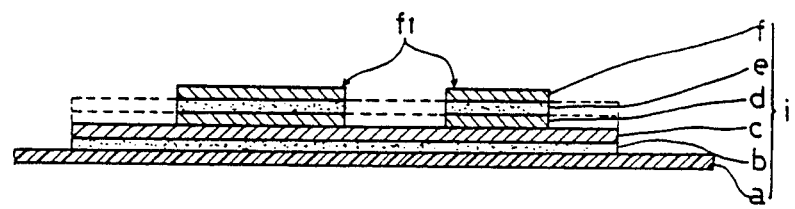
Fig. 1 (D) (PRIOR ART)
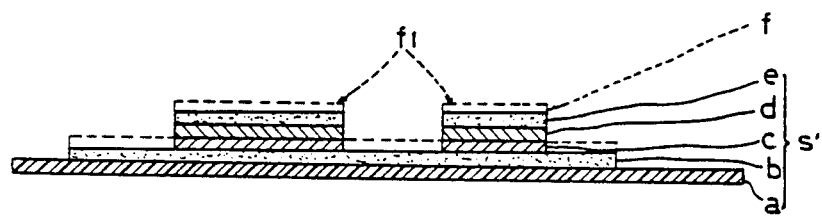

111
TRANSFER SHEET WITH COLOR PATTERN HAVING METALLIC LUSTER, AND METHOD OF MANUFACTURING SAID SHEET

CROSS-REFERENCE TO RELATED APPLICATION

This application is a division of application Ser. No. 581,829, filed Feb. 21, 1984.

BACKGROUND OF THE INVENTION

The present invention relates to a transfer sheet with a color pattern having metallic luster, and a method of manufacturing such transfer sheet.

For example, a commercial designer may prepare or make presentation of a dummy or mockup required for determining the design of a label, display, package or signature. In order to obtain a beautiful pattern having golden or silver metallic luster, it is conventionally required to use a hot-stamp method.

Accordingly, even when only one dummy or mock up is necessary, there is required a troublesome and very expensive method taking much labor and time, said method comprising the steps of: making a metal mold or foil pressing die (mold pressing plate) corresponding to a designed pattern or figure, according to mechanical cutting or chemical machining of a metallic plate such as a brass plate; mounting this foil pressing die to a foil pressing machine; strongly pressing this die heated to high temperatures to the surface of a predetermined base member by a mechanical operation; and stamping out a metallic foil according to the shape and size of the foil pressing die, simultaneously with contact-fusing and transferring the metallic foil to the surface of the base member. Such a method can be achieved only by a few specially equipped companies provided with very expensive hot-stamping facilities. This causes inconveniences and limitations.

In fact, there is often some reluctance to order such transfer sheet with a desired pattern having metallic luster, due to the comparatively expensive costs generally incurred regardless of the object and use, and in particular the extremely expensive costs incurred when a required amount of transfer sheets is relatively small.

In view of the foregoing, the inventor has made progress in his studies and experiments through many years in order to solve and eliminate such inconveniences and limitations for meeting the needs from the industry and the persons concerned.

As a result, the inventor has proposed the following new technology (hereinafter referred to as the prior art) on which a patent application was filed in Japan on Oct. 29, 1983, Ser. No. SHO57-190281 published May 9, 1984, under No. 57-190281.

As shown in FIG. 1(A), the transfer sheet according to the prior art comprises a transparent base film a, a mold-removing film layer b on one side thereof, a metallic foil layer c such as an aluminum foil having a desired color pattern disposed on the mold-removing film layer b, a protective film layer d on the metallic film layer c, and an adhesives layer e on the protective film layer d. Namely, the inventor has proposed a method of manufacturing such transfer sheet S', FIG. 1(A), with the use of which a desired color pattern having metallic luster is securely transferred by a simple operation. That is, with the sheet S' applied at its layer e to an objective article to which transfer is to be made, the base film a is rubbed at its other side with a roller or rod having a suitable hardness.

The description hereinafter will discuss in detail this method of manufacturing such transfer sheet S'.

As shown in FIGS. 1(A), (B), (C) and (D), the method comprises the steps of:

(I') forming a mold-removing film layer b having adhesive property on one side of a transparent base film a;

(II') forming a metallic foil layer c by contact-pressing a metallic foil in desired colors, onto the mold-removing film layer b;

(III') forming a protective film layer d with an oily ink ink on the metallic foil layer c;

(IV') forming an adhesives layer e with an oily paste on the oily protective film layer d;

(V') forming an aqueous sensitizer layer f on the oily adhesives layer e;

(VI') placing an original film g in which the desired pattern is negative, on the sensitizer layer f so as to come in close contact therewith, irradiating ultraviolet rays onto the film g with the use of ultraviolet rays lamps h for printing, and removing the original film g;

(VII') washing in water the base sheet i obtained according to the steps of (I') to (VI'), thereby to dissolve and remove the unexposed portions $f_2$ of the aqueous sensitizer layer f other than the exposed and solidified portions $f_1$ thereof (See FIG. 1(B));

(VIII') washing in an oily solvent the base sheet i, thereby to dissolve and remove the other portions of the oily adhesives layer e and oily protective layer d other than the portions thereof located under the exposed and solidified portions $f_1$ of the sensitizer layer f (See FIG. 1(C));

(IX') removing by, for example, rubbing off, the exposed and solidified portions $f_1$ of the sensitive layer f, and applying etching to the base sheet i with the use of a suitable solvent, thereby to dissolve and remove the portions of the metallic foil layer c other than the portions thereof located under the remaining portions of the oily adhesives layer e and the oily protective film layer d, thus completing a desired transfer sheet S' (See FIG. 1(D)).

At the stage of preparation or presentation of a dummy or mock-up of, for example, a commercial design, this method for manufacturing a transfer sheet according to the prior art above-mentioned, enables to prepare a transfer sheet having a function substantially the same as that of a transfer sheet obtained according to a conventional hot-stamping method, much more easily, readily and economically than the conventional method. This method, however, includes a defect in that the step (II') of forming a metallic foil layer c neatly with a metallic foil attached to the mold-removing film layer b, is technically very difficult and, in consequence, requires high skill.

SUMMARY OF THE INVENTION

The present invention is proposed as a result of a series of experiments and studies taking the foregoing into account.

It is a main object of the present invention to eliminate the practical inconvenience above-mentioned and to enable a transfer sheet having such excellent function as above-mentioned, to be manufactured more readily, efficiently and economically.

It is another object of the present invention to reduce, while fully maintaining the excellent function inherent in such transfer sheet, the number of layers constituting the transfer sheet, as well as the number of steps for obtaining a desired pattern, thus enabling further economical and efficient production of transfer sheets, in particular for mass production.

In order to achieve these objects, the transfer sheet with a color pattern having metallic luster according to one aspect of the invention is characterized by comprising; a transparent or semi-transparent base film, a mold-removing film layer on one side thereof, a transparent coloring agent layer to form the desired pattern on the mold-removing film layer, an aluminum vapor-coated layer on the transparent coloring agent layer, a protective film layer on the aluminum vapor-coated layer and an adhesives layer on the protective film layer.

The method of manufacturing such transfer sheet with a color pattern having metallic luster in accordance with one aspect of the present invention comprises the steps of:

(I) forming a mold-removing film on one side of a transparent or semi-transparent base film;

(II) forming a semi-aqueous transparent coloring agent layer on the mold-removing film layer;

(III) forming an aluminum vapor-coated layer on the transparent coloring agent layer;

(IV) forming a protective film layer with an oily ink on the aluminum vapor-coated layer;

(V) forming an adhesives layer with an oily paste on the oily protective film layer;

forming an aqueous sensitizer layer on the oily adhesives layer;

(VII) placing an original film in which the desired pattern is negative, on the sensitizer layer so as to come in close contact therewith, irradiating rays of light onto the original film for printing, and removing the original film;

(VIII) washing in water the base sheet obtained according to the steps of (I) to (VII), thereby to dissolve and remove unexposed portions of the aqueous sensitizer layer other than the exposed and stabilized portions thereof;

(IX) washing in an oily solvent the base sheet, thereby to dissolve and remove portions of the oily adhesives layer and the oily protective film layer other than the portions thereof located under the exposed and solidified portions of the sensitizer layer; and (X) removing the exposed and solidified portions of the sensitizer layer and applying etching to the base sheet with the use of a suitable solvent, thereby to dissolve and remove portions of the aluminum vapor-coated layer other than the portions thereof located under the remaining portions of the oily adhesives layer and the oily protective film layer.

According to the transfer sheet with a color pattern having metallic luster and the method of manufacturing such transfer sheet of the present invention having such characteristic as above-mentioned, the layer for providing metallic luster is formed by an aluminum vapor-coated layer, and not formed by a layer having a metallic foil attached thereto as done in the prior art.

The present invention thus enables to provide, readily and economically, a transfer sheet having an excellent function by which a more beautiful color pattern is transferred to any appropriate article.

The transfer sheet with a color pattern having metallic luster according to another aspect of the invention is characterized by comprising; a transparent or semi-transparent base film, a mold-removing film layer on one side thereof, a transparent coloring agent layer in the form of a desired pattern formed on the mold-removing film layer, an aluminum vapor-coated layer on the transparent coloring agent layer, and an adhesives layer on the aluminum vapor-coated layer.

Likewise the transfer sheet according to another aspect of the invention may fulfil an excellent function of transferring, readily and beautifully, a color pattern to an appropriate article. Besides, the number of layers of this transfer sheet is less than that of the transfer sheet according to one aspect of the invention, permitting to basically reduce the number of manufacturing steps. Such reduction enables to produce such transfer sheet more economically.

The method of manufacturing such transfer sheet with a color pattern having metallic luster comprises the steps of:

(I) forming a mold-removing film layer on one side of a transparent or semi-transparent base film;

(II) forming a semi-aqueous transparent coloring agent layer on the mold-removing film layer;

(III) forming an aluminum vapor-coated layer on the transparent coloring agent layer;

(IV) printing an oily adhesives layer in the form of the desired pattern on the aluminum vapor-coated layer; and (V) applying etching to the base sheet obtained according to the steps of (I) to (IV) with the use of a suitable solvent, thereby to dissolve and remove portions of the aluminum coloring agent layer other than those portions of the aluminum vapor-coated layer, the transparent coloring agent layer and the mold-removing film layer being located under the oily adhesives layer, the oily adhesives layer being in the form of the desired pattern and said those portions remaining on the base film.

For forming a desired pattern, this method does not employs such photograph process as shown in the method of manufacturing the transfer sheet according to one aspect of the present invention, but employs a simple print process merely requiring etching, thus eliminating the steps of exposure, washing in water and washing in an oily solvent. This method thus enables a very easy, efficient and more economical production of transfer sheet. This method is therefore extremely advantageous, in particular for mass production of marketing sheets, order-made sheets and novelty premium sheets.

BRIEF DESCRIPTION OF THE DRAWINGS

FIGS. 1(A), (B), (C) and (D) are sequential views illustrating a transfer sheet and a method of manufacturing the same in accordance with prior art.

DETAILED DESCRIPTION OF THE PREFERRED EMBODIMENTS

Example 1

Figure 2:
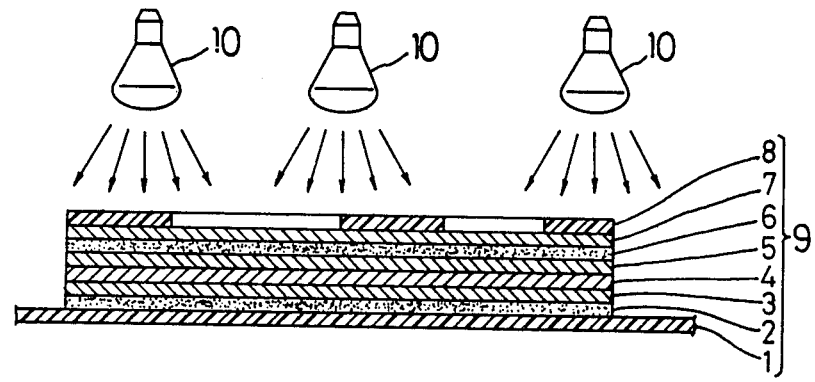
FIGS. 2(A), (B), (C) and (D) are sequential views illustrating a first embodiment of transfer sheet with a color pattern having metallic luster, and method of manufacturing the same, in accordance with the present invention.
Figure 2:
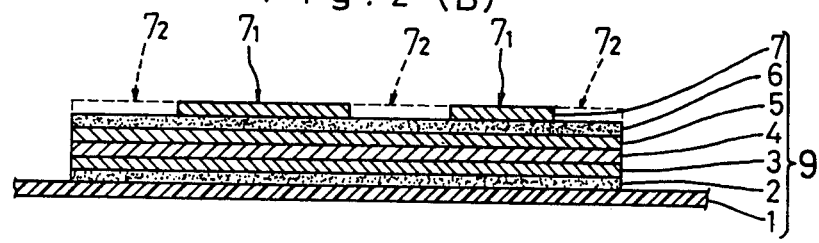
Figure 2:
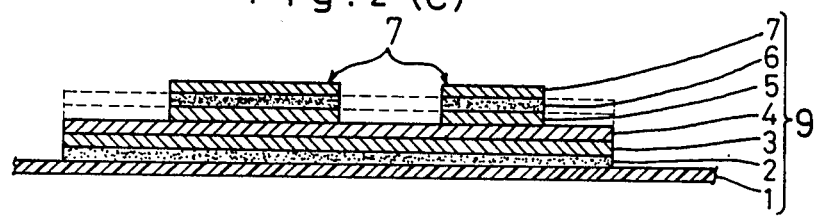
Figure 2:
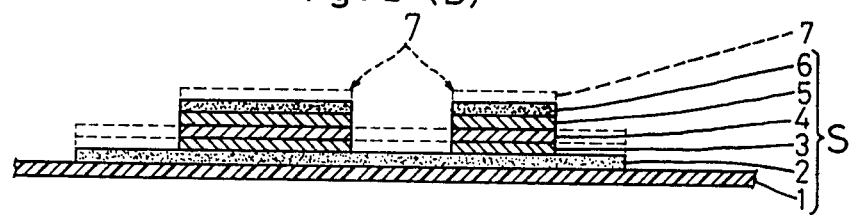

As illustrated at FIGS. 2(A) through 2(D) a transfer sheet with a color pattern having metallic luster may be made according to a method comprising the steps of:

(I) forming a mold-removing film layer 2, FIG. 2(A); by applying a suitable oily or semi-aqueous mold-removing liquid having a weak viscosity (unsoluble both in water and an oily solvent but soluble in an alkaline solution such as an etching treatment liquid) to one side of a base film 1 made of a transparent or semi-transparent film of a suitable synthetic resin (for example, polyesther or acetate) which can stand the operation for transfer without either stretch or creases;

(II) forming a semi-aqueous transparent coloring agent layer 3, in desired color for a metallic luster face having other color than silver, and in a colorless state for a silver luster face;

(III) forming an aluminum vapor-coated layer 4 by vapor-coating, in vacuum, the entire surface of the transparent coloring agent layer 3 with aluminum according to a conventional method; (IV) forming a protective film layer 5 with an oily ink on the aluminum vapor-coated layer 4;

(V) forming an adhesive layer 6 with an oily paste on the oily protective film layer 5;

(VI) forming an aqueous sensitizer layer 7 on the oily adhesive layer 6 (It is preferable to use an aqueous sensitizer called CHROMATEC A or B. This may be readily obtained together with predetermined machine parts called CHROMATEC STARTING KIT through LETRASET Japan Kabushiki Kaishya having its head office at Mita, Minato-ku, Tokyo. When the sensitizer CHROMATEC A or B is applied to the surface of the oily adhesives agent layer 6 with the use of the coating rod and the working bench (equipped with a mat) included in this KIT, it is preferred to apply in advance a small amount of predetermined pin-hole prevention agent to the entire surface of the adhesives layer 6 before application of the sensitizer thereto.);

(VII) placing a separately prepared original film 8 in which the desired pattern is negative, to the sensitizer layer 7 so as to come in close contact therewith after the sensitizer layer 7 has been dried, irradiating ultraviolet rays onto the original film 8 by, for example, ultraviolet-rays lamps 10 for printing (exposure), and removing the original film 8;

(VIII) washing in water the base sheet 9 obtained according to the steps (I) to (VII) at, for example, a water washing bench, thereby dissolving and removing unexposed portions $7_2$ of the aqueous sensitizer layer 7 other than the exposed and solidified portions $7_1$ thereof, so that the portions of the oily adhesives layer 6 located below these portions $7_2$ are exposed as shown in FIG. 2(B);

(IX) washing in an oily solvent the base sheet, thereby dissolving and removing exposed portions of the oily adhesives layer 6 and the oily protective film layer 5 other than the portions thereof located under the exposed and solidified portions $7_1$ of the sensitizer layer 7, so that those portions of the aluminum vapor-coated layer 4 located under the unexposed portions $7_2$ are exposed as shown in FIG. 2(C); and (X) removing, while rubbing, the exposed and solidified portions $7_1$ of the sensitive layer 7 with a sponge bar impregnated with a treatment liquid such as CHROMATEC D3' (product name), and applying etching to the base sheet 9 with the use of a suitable solvent such as a 5–30% sodium hydroxide solution, thereby dissolving and removing exposed portions of the aluminum vapor-coated layer 4 other than those portions located under the remaining portions of the oily adhesives layer 6 and the oily protective film layer 5 as shown in FIG. 2(D).

As shown by the solid lines in FIG. 2(D), the transfer sheet S made according to the steps above-mentioned, comprises the transparent or semi-transparent base film 1, the mold-removing film layer 2 on one side of the base film 1, the transparent coloring agent layer 3 in the form of a desired pattern formed on the mold-removing film layer 2, the aluminum vapor-coated layer 4 on the transparent coloring agent layer 3, the protective film layer 5 on the aluminum vapor-coated layer 4, and the adhesives layer 6 on the protective film layer 5.

Since the transparent coloring agent layer 3 is semi-aqueous, those portions of this coloring agent layer 3 located below the exposed portions of the aluminum vapor-coated layer 4 are dissolved likewise said exposed portions of the coloring agent layer 3 by a sodium hydroxide solution used as an etching treatment liquid.

Those portions of the coloring agent layer 3 and the aluminum vapor-coated layer 4 are accurately dissolved along the boundary lines of a predetermined pattern or design, thus enabling to produce a transfer sheet S having a pattern or figure of which the boundaries are sharply cut.

Example 2

Figure 3:
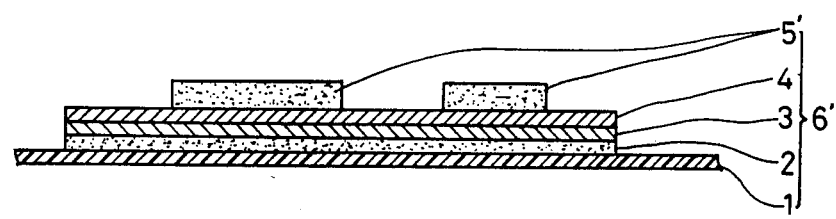
FIGS. 3(A) and (B) are sequential views illustrating a second embodiment of transfer sheet with a color pattern having metallic luster; and method of manufacturing the same in accordance with the present invention.
Figure 3:
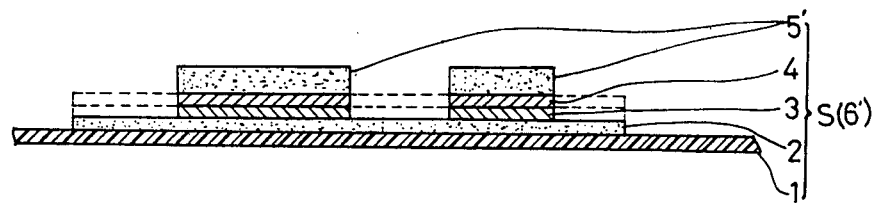

A transfer sheet with a color pattern having metallic luster may be made according to a method, FIGS. 3(A)-3(B), comprising the steps of:

(I) forming a mold-removing film layer 2 FIG. 2(A) by applying a suitable oily or semi-aqueous mold-receiving liquid having a weak viscosity (unsoluble both in water and an oily solvent but soluble in an alkaline solution such as an etching treatment liquid) to one side of a base film 1 made of a transparent or semi-transparent film of a suitable synthetic resin (for example, polyesther or acetate) which can stand operation for transfer without either stretch or creases;

(II) forming a semi-aqueous transparent coloring agent layer 3, in desired color for a metallic luster face having other color than silver, and in a colorless state for a silver luster face;

(III) forming an aluminum vapor-coated layer 4 by vapor-coating, in vacuum, the entire surface of the transparent coloring agent layer 3 with aluminum according to a conventional method;

(IV) printing a relatively thick oily adhesives layer 5' in the form of the desired pattern constituted by an oily paste alone or by a mixture or composition of an oily paste and an oily ink, on the aluminum vapor-coated layer 4 according to a silk printing method for example; and (V) applying etching to the base sheet 6' obtained according to the steps of (I) to (IV) with the use of a suitable solvent (for example, a 5–30% sodium hydroxide solution), thereby to dissolving and removing portions of at least the aluminum vapor-coated layer 4 and the transparent color agent layer 3 other than those portions of the aluminum vapor-coated layer 4 colors having desired metallic luster by the transparent coloring agent layer 3, and of the mold-removing film layer 2 which are located under the oily adhesives layer 5', those portions of the aluminum vapor-coated layer 4 and the mold-removing film layer 2 remaining on the base film 1 together with the oily adhesives layer 5' in the form of the desired pattern (When the mold-removing film layer 2 is oily, the layer 2 is not dissolved at all at the time of etching. When the layer 2 is semi-aqueous, portions of this layer 2 other than those portions located under the oily adhesives layer 5' are dissolved.).

As shown by the solid lines in FIG. 3(B), the transfer sheet S made according to the steps above-mentioned comprises the transparent or semi-transparent base film 1, the mold-removing film layer 2 on one side of the base film 1, the transparent coloring agent layer 3 in the form of the desired pattern on the mold-removing film layer 2, the aluminum vapor-coated layer 4 on the transparent coloring agent layer 3, the adhesives layer 5' on the aluminum vapor-coated layer 4.

Figure 4:
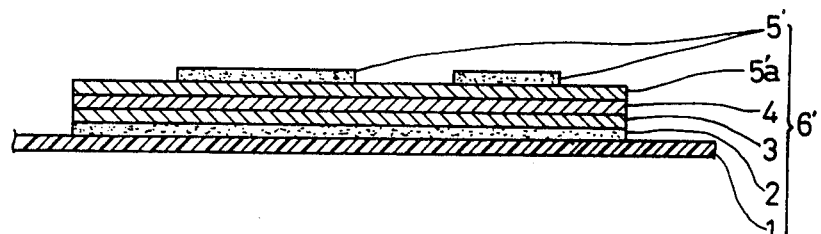
FIGS. 4(A) and (B) are sequential views illustrating a third embodiment of transfer sheet with a color pattern having metallic luster and method of manufacturing the same in accordance with the present invention.
Figure 4:
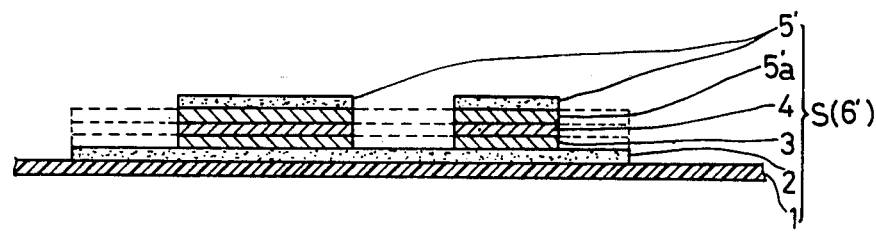
Figure 5:
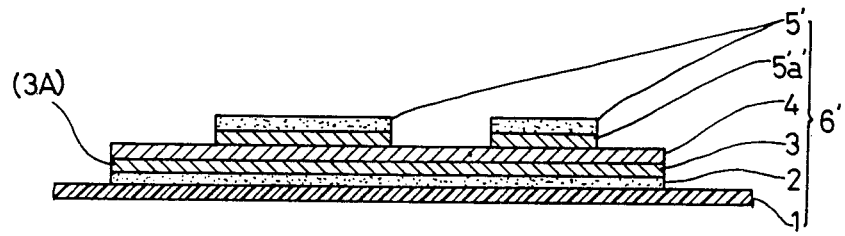
FIGS. 5(A) and (B) are sequential views illustrating a forth embodiment of transfer sheet with a color pattern having metallic luster and method of manufacturing the same in accordance with the present invention.
Figure 5:
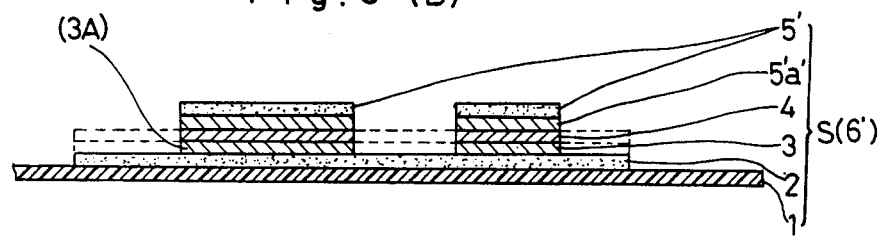

FIGS. 4 and 5 respectively illustrate modifications of Example 2 embodiment of the invention. It will be appreciated that the modifications illustrated at FIGS. 4 and 5 are also included in the scope of the present invention.

Example 3

The method illustrated at FIGS. 4(A) and 4(B), additionally includes a step IVa of forming a semi-aqueous protective film layer 5'a between the steps of III and IV in the method of Example 2. This protective film layer 5'a is semi-aqueous. Therefore, portions of this protective film layer 5'a, other than the portions thereof located below the oily adhesives layer 5', are dissolved at the time of the subsequent step IV of the etching process. Presence of this protective film layer 5'a not only prevents the aluminum vapor-coated layer 4 from being damaged at the time of printing of the adhesives layer 5', but also enables to reduce the thickness of the adhesives layer 5'.

Example 4

The method shown in FIGS. 5(A) and 5(B) additionally includes a step IVb of printing a semi-aqueous or oily protective film layer 5'a' in the form of the predetermined pattern by, for example, a silk printing step, between the steps III and IV of the method according to Example 2. In this method, two printing steps are applied. It is therefore required to use care such that the protective film layer 5'a' and the adhesives layer 5' have no positional shift.

Each of the transfer sheets S made according to the methods above-mentioned, may be used in the following way.

The transfer sheet is placed in contact, at its side of the uppermost adhesives layer 5 or 5', with the surface of a desired article (not shown) to which transfer is to be made. The base film 1 is then rubbed at its other side, or its side opposite to its side facing the mold-removing film layer 2, with a roller, a steel pen or the like having a suitable hardness. Thus, the surface of the adhesives layer is securely adhered to the article. The base film 1 is then torn off, thus transferring the desired color pattern having a beautiful metallic luster, to the surface of the article.

I claim:

1. A method of manufacturing a transfer sheet with a color pattern having metallic luster comprising the steps of:

(I) forming a mold-removing film layer on one side of a transparent or semi-transparent base film;

(II) forming a semi-aqueous transparent coloring agent layer on said mold-removing film layer;

(III) forming a vapor-coated aluminum layer on said transparent coloring agent layer;

(IV) forming a protective film layer with an oily ink on said vapor-coated aluminum layer;

(V) forming an adhesive layer with an oily paste on said oily protective film layer; and (VI) placing an original film in which the desired pattern is negative on said sensitizer layer in close contact therewith, irradiating light rays onto said original film for printing, and removing said original film;

(VII) washing in water the base sheet obtained according to the steps (I) to (VI), thereby dissolving and removing unexposed portions of said aqueous sensitizer layer other than the exposed and solidified portions thereof;

(IX) washing in an oily solvent said base sheet, thereby dissolving and removing portions of said oily adhesive layer and said oily protective film layer other than those portions thereof located under the exposed and solidified portions of said sensitizer layer;

(X) removing the exposed and solidified portions of said sensitizer layer, and applying etching to said base sheet with the use of a suitable solvent, thereby dissolving and removing portions of said vapor-coated aluminum layer other than those portions thereof located under the remaining portions of said oily adhesive layer and said oily protective film layer.

* * * * *